United States Patent
Kitaguchi

[11] Patent Number: 5,878,333
[45] Date of Patent: Mar. 2, 1999

[54] TUNER WITH COAXIAL RESONATOR TRIMMER

[75] Inventor: Masanori Kitaguchi, Osaka, Japan

[73] Assignee: Sharp Kabushiki Kaisha, Osaka, Japan

[21] Appl. No.: 731,234

[22] Filed: Oct. 11, 1996

[30] Foreign Application Priority Data

Oct. 13, 1995 [JP] Japan ................................. 7-265373

[51] Int. Cl.⁶ .................................................... H04B 1/16
[52] U.S. Cl. ........................ 455/196.1; 455/255; 333/223; 334/44; 334/82
[58] Field of Search ............................ 455/178.1, 182.1, 455/182.2, 192.1, 192.2, 192.3, 195.1, 196.1, 255, 256, 257–265; 334/80, 82, 40, 41, 44; 331/101, 175, 176, 177 R, 177 V, 117 D; 33/222, 223

[56] References Cited

U.S. PATENT DOCUMENTS

| | | | |
|---|---|---|---|
| 3,643,168 | 2/1972 | Manicki | 455/178.1 |
| 4,251,849 | 2/1981 | Kawai | 361/278 |
| 4,467,393 | 8/1984 | Kupfer | 361/278 |
| 4,500,854 | 2/1985 | Meyer | 331/177 V |

FOREIGN PATENT DOCUMENTS

| | | |
|---|---|---|
| 58-096308 | 6/1983 | Japan . |
| 59-152844 | 10/1984 | Japan . |
| 60-116727 | 8/1985 | Japan . |

*Primary Examiner*—Reinhard J. Eisenzopf
*Assistant Examiner*—Lester G. Kincaid

[57] ABSTRACT

A tuner circuit includes a first IF signal generating a first oscillation signal, a local oscillator circuit outputting a local oscillator signal, a mixing circuit mixing the first IF signal and the oscillation signal to generate a second IF signal, and a first substrate on which at least the local oscillator signal is formed. The local oscillator circuit includes an oscillation circuit and a coaxial resonator connected to the oscillation circuit for correcting the influence of change in oscillation frequency owing to moisture and secular change. The coaxial resonator includes an impedance variable trimmer portion for adjusting the oscillation frequency, a central conductor provided at a fixed position with respect to the first substrate, and an insulator for providing insulation between the impedance variable trimmer and the central conductor. The impedance variable trimmer portion and the central conductor are adhered to one another via the insulator after adjusting is completed.

28 Claims, 5 Drawing Sheets

GND  AFT  B  OUT

TUNER WITH COAXIAL RESONATOR TRIMMER

BACKGROUND OF THE INVENTION

1. Field of the Invention

The present invention relates to a tuner circuit employed in a high-frequency circuit device in a television receiver or a video tape recorder, and particularly to a tuner circuit having a local oscillator circuit including a coaxial resonator.

2. Description of the Background Art

Referring to FIGS. 1 to 3, description will be given for a conventional double-conversion tuner. Referring to FIG. 1, the double-conversion tuner includes an input terminal 100 for inputting an RF (Radio Frequency) signal, an RF bandpass filter 101 for extracting the required frequency component for the RF signal, a broadband amplifier 102 for amplifying the RF signal, a clock signal input terminal 106 for inputting a clock signal, a data signal input terminal 107 for inputting a data signal, a PLL (Phase Locked Loop) circuit 105 for accurately obtaining a first local oscillator signal L01 described below, a first local oscillator circuit 104 connected to PLL circuit 105 for generating the first local oscillator signal L01, a first mixer 103 for mixing the RF signal output from broadband amplifier 102 with first local oscillator signal L01 output from first local oscillator circuit 104 to generate a first IF (Intermediate Frequency) signal, a bandpass filter 108 for extracting required frequency component of the first IF signal, an AFT terminal 114 to which an output voltage of an AFT (Automatic Fine Tuning) detection circuit described below is applied, a second local oscillator circuit 110 connected to AFT terminal 114 for generating a second local oscillator signal L02, a second mixer 109 for mixing the first IF signal output from bandpass filter 108 and second local oscillator signal L02 output from the second local oscillator circuit for generating a second IF signal, a bandpass filter 111 for extracting the required frequency component of the second IF signal, a first IF amplifier 112 for amplifying the second IF signal, and an output terminal 113 for outputting the second IF signal.

The RF signals input from input terminal 100 are input to first mixer 103 via RF bandpass filter 101 and broadband amplifier 102. RF signals are mixed further with first local oscillator signals L01 corresponding to a selected channel from first local oscillator circuit 104 and are converted by frequency into the fist IF signals. Unwanted signals other than those at the selected channel are eliminated from the first IF signals by bandpass filter 108 and are input to second mixer 109. The first IF signals are mixed with second local oscillator signals L02 and are converted by frequency into the second IF signals. The second IF signals are output from output terminal 113 via bandpass filter 111 and IF amplifier 112.

The second IF signal has its phase detected by an AFT detection circuit not shown which is connected to the following stage. This voltage is applied to an AFT terminal 114 so as to correct the oscillation frequency of second local oscillator signal L102 such that the second IF signal would be at a normal frequency. Accordingly, the influence of change in the oscillation frequency owing to temperature and secular change, and the influence of offset in the sent RF signals are corrected.

Referring FIG. 2, the second local oscillator circuit 110 includes a coaxial resonator 115, a transistor Tr for oscillation, bias resistors R3, R4 and R5, a junction capacitor C1, feedback capacitors C5 and C6, a coupling capacitor C7, and a ground condenser C8, a bias resistor R2, a bias resistor R1, and a power supply terminal B.

Coaxial resonator 115 includes a Z0 trimmer 201 for adjusting oscillation frequency, a central conductor 200, a variable capacitance diode D, tuning capacitors C2, C3 and C4.

Specifically, second local oscillator circuit 110 is formed of a modified Colpitts oscillation circuit in which transistor Tr for oscillation has its base in junction with central conductor 200, tuning capacitors C2, C3, C4 and variable capacitance diode D, employing a reduced $\lambda/2$ coaxial resonator. The cathode of variable capacitance diode D is connected to power supply terminal B via bias resistor R1. Meanwhile, the anode of variable capacitance diode D is connected to AFT terminal via bias resistor R2.

Referring to FIGS. 3A and 3B, central conductor 200 and Z0 trimmer 201 are respectively formed by punching a metal plate in U-shape, as shown in FIG. 3A. They are inserted into a printed board which is to be the main substrate of the tuner, and are fixed by soldering. As shown in FIG. 3B, adjustment of oscillation frequency for correcting offset thereof owing to variation of the components forming the oscillation circuit had been effected by tilting Z0 trimmer 201 toward or away from central conductor 201.

In a tuner circuit formed as described above, central conductor 200 and Z0 trimmer 201 respectively have different shapes and masses, and are mounted onto printed board 202 independently. Accordingly, when the entire tuner is subjected to oscillation, central conductor 200 and Z0 trimmer 201 respectively oscillate in different modes. Thus, howling occurs, causing failures in reception such as disturbance in video information and generation of noise.

In order to prevent this occurrence of howling, central conductor 200 and Z0 trimmer 201 are respectively fixed by paraffin or silicon adhesive. When this is done, however, influence of shrinkage of the adhesive due to its curing and the like may cause offset in the oscillation frequency to degrade its accuracy. To deal with this problem, adjustments were carried on by estimations, estimating the degree of change such as in shrinkage and the like in advance, but accuracy of such adjustments were limited.

Based on the foregoing, since application of adhesive is required, and since it is necessary to adjust the oscillation frequency considering the influence of the adhesive, difficulties of the process is increased, and moreover, decrease is caused in the yield, thus substantially raising the cost of the product.

SUMMARY OF THE INVENTION

It is an object of the invention to provide a highly reliable tuner circuit which can receive a high-frequency signal in a satisfactory state even when the entire tuner circuit is subjected to oscillation.

It is another object of the present invention to provide a tuner circuit which can perform an adjustment of oscillation frequency efficiently and easily.

It is a further object of the present invention to provide a tuner circuit with high yield relating to adjustment of oscillation frequency.

It is still another object of the present invention to provide a low cost tuner circuit relating to adjustment of oscillation frequency.

In accordance with the present invention, a tuner circuit includes a first IF signal generating circuit for outputting a first IF signal, a local oscillator circuit for outputting a local oscillator signal, a mixing circuit for mixing the first IF signal and the local oscillator signal to generate a second IF signal, and a first substrate on which at least the local oscillator circuit is formed. The local oscillator circuit includes oscillation means and a coaxial resonator connected to the oscillation means. The coaxial resonator includes an impedance variable trimmer for adjusting oscillation frequency, a central conductor provided at a fixed position with respect to the first substrate, and an insulator for providing insulation between the impedance variable trimmer and the central conductor. The impedance variable trimmer and the central conductor are adhered to each other via the insulator.

Preferably, the local oscillator circuit further includes a second substrate provided to stand up substantially vertically to the first substrate and having first and second surfaces, the central conductor being formed at the first surface while the impedance variable trimmer is arranged at the side of the first surface and formed from a soft conducting wire. The insulator includes an insulating coating for covering the soft conducting wire which is made to stand up along the first surface of the second substrate from the first substrate while being adhered to the central conductor.

The second substrate may be formed of alumina.

The local oscillator circuit of the tuner circuit is formed on the first substrate. The coaxial resonator of the local oscillator circuit is connected to the oscillation means and corrects the influence of the change in oscillation frequency owing to moisture and secular change. The impedance variable trimmer adjusts the oscillation frequency. The central conductor is provided at a fixed position with respect to the first substrate. The impedance variable trimmer and the central conductor are adhered to each other via the insulator.

Accordingly, since the central conductor provided at the fixed position with respect to the first substrate and the impedance variable trimmer are adhered to each other, they oscillate at the same oscillation mode even when the entire tuner circuit is subjected to oscillation. Accordingly, there is no howling between the two, and thus the oscillation frequency is not affected. Therefore, it is possible to provide a highly reliable tuner circuit which can receive a high-frequency signal in a satisfactory state.

The second substrate having the first and second surfaces is provided to stand up substantially vertically on the first substrate. The impedance variable trimmer formed from soft conducting wire is arranged at the side of the first surface. The insulating coating covers the soft conducting wire. The soft conducting wire is made to stand up from the first substrate along the first surface of the second substrate and is adhered to the central conductor. Accordingly, by deforming the soft conducting wire making it to slide along the first surface of the second substrate, it is possible to adjust the oscillation frequency. Thus, it is possible to adjust the oscillation frequency easily as well as to provide a low cost tuner circuit with high yield as compared to the case in which the central conductor and the impedance variable trimmer are respectively fixed and adjustment is performed by estimation.

The second substrate is formed of alumina. Accordingly, the central conductor is formed on an alumina substrate which has superior resistance to moisture, and thus offset of oscillation frequency due to moisture can be suppressed to low extent even when the oscillation frequency is high. Thus, it is possible to provide a highly reliable tuner circuit which can receive a high-frequency signal at a satisfactory state.

In accordance with another aspect of the present invention, a tuner circuit includes a first IF signal generating circuit for outputting a first IF signal, a local oscillator signal for outputting a local oscillator signal, a mixing circuit for mixing the first IF signal and the local oscillator signal to generate a second IF signal, and a first substrate on which at least the local oscillator circuit is formed. The local oscillator circuit includes an oscillation circuit and a coaxial resonator connected to the oscillation circuit. The coaxial resonator is disposed along the first substrate and includes a central conductor formed from a soft conducting wire.

The local oscillator circuit of the tuner circuit is formed on the first substrate. The coaxial resonator of the local oscillator circuit is connected to the oscillation circuit. The central conductor is formed from a soft conducting wire and is formed along the first substrate. By deforming the central conductor itself, oscillation frequency is adjusted.

Accordingly, it is possible to provide a highly reliable tuner circuit in which a high-frequency signal can be received at a satisfactory state by a simple structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be given in the following, with reference to the drawings.

First Embodiment

The feature of the present invention exist in that a central conductor and a Z0 trimmer are adhered to one another via an insulator in a tuner having a local oscillator circuit including a coaxial resonator, such that howling between the central conductor and the Z0 trimmer is prevented.

Figure 1:
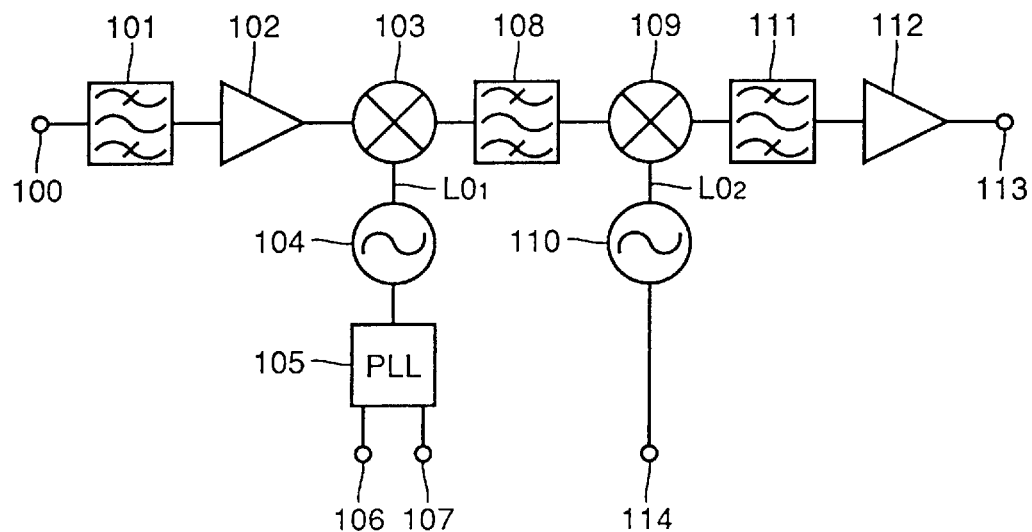
FIG. 1 is a block diagram of a conventional double-conversion tuner.
Figure 2:
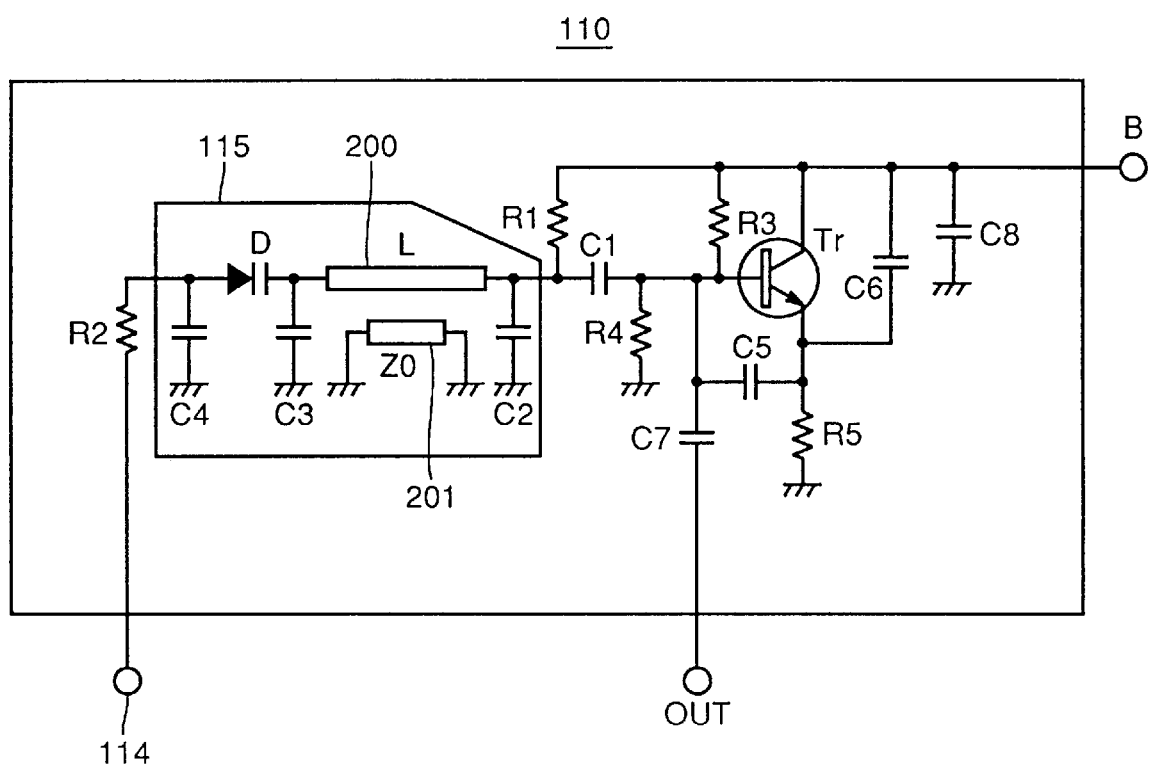
FIG. 2 is a schematic diagram of a second local oscillator circuit of a conventional double-conversion tuner.
Figure 3A:
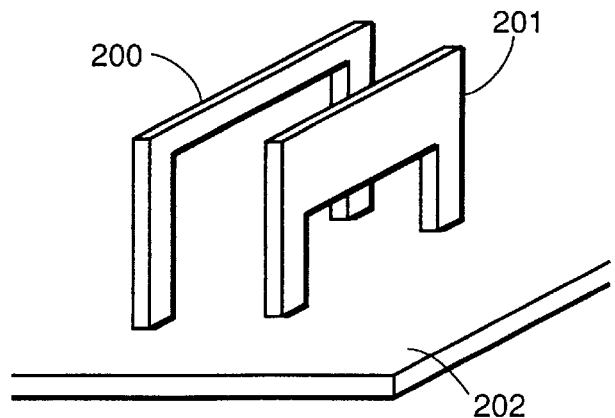
FIG. 3A is a perspective view of a substrate on which a central conductor and a Z0 trimmer of the second local oscillator circuit are formed.
Figure 3B:
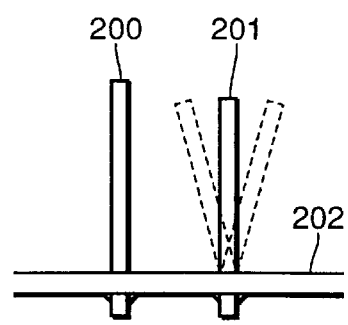
FIG. 3B is a side view of a substrate on which the central conductor and the Z0 trimmer of the second local oscillator circuit are formed.

The block diagram of a tuner and the schematic diagram of the second local oscillator circuit for the present embodiment have common features with respect to the block diagram of the aforementioned conventional double-conversion tuner and the schematic diagram of the second local oscillator circuit of the conventional double-conversion circuit shown respectively in FIGS. 1 and 2. Thus, description thereof will not be detailed here again.

Figure 4A:
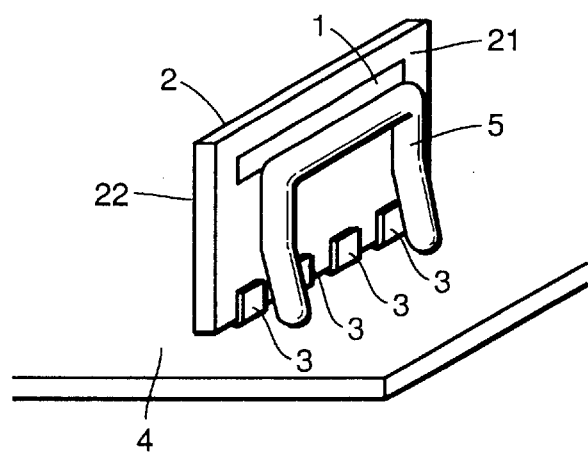
FIG. 4A is a perspective view of a substrate having a local unit substrate on which the central conductor is formed and the Z0 trimmer formed thereon according to the present invention.
Figure 4B:
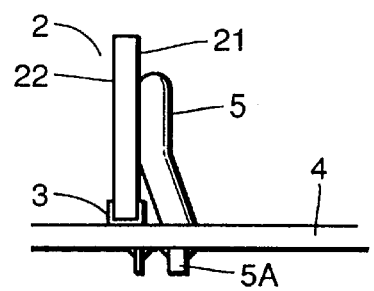
FIG. 4B is a side view of a substrate having a local unit substrate on which the central conductor is formed and the Z0 trimmer formed thereon according to a first embodiment of the present invention.
Figure 4C:
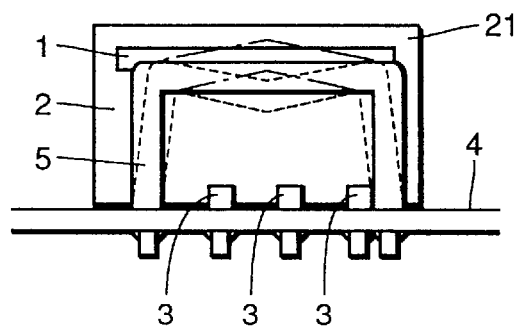
FIG. 4C is a front view of the substrate having the local unit substrate on which the central conductor is formed and the Z0 trimmer formed thereon according to the first embodiment of the present invention.

Referring to FIGS. 4A, 4B and 4C, a second local oscillator circuit 110 includes a tuner main substrate 4 on which at least the second local oscillator circuit is formed, a local unit substrate provided to stand up substantially vertically to tuner main substrate 4 having a first surface 21 and a second surface 22, a terminal 3 for electrically connecting the circuit on local unit substrate 2 and the circuit on tuner main substrate 4, a central conductor 1 formed at first surface 21 of local unit substrate 2, and a Z0 trimmer 5 disposed at the side of first surface of local unit substrate 2 for adjusting the oscillation frequency.

In the present embodiment, central conductor 1 is patterned on first surface 21 of local unit substrate 2. Also, as will be described below, each of the components in the second local oscillator circuit employing a reduced $\lambda/2$ coaxial resonator is provided on second surface 22 opposite to first surface 21 on which central conductor 1 is formed. In addition, local unit substrate 2 is provided with terminal 3 of a lead frame. Local unit substrate 2 is inserted to tuner main substrate 4 as a local unit and is fixed there by soldering.

Z0 trimmer 5 has its coating removed at a portion 5A where it is inserted to the substrate, and is formed by an electric wire coated with ethylene-tetra fluoro ethylen-copolymer bent in a U-shape. Z0 trimmer 5 is inserted to tuner main substrate 4 to be adjacent to the aforementioned local unit substrate 2, and is fixed by soldering. Here, Z0 trimmer 5 is formed to stand up from tuner main substrate 4 along local unit substrate 4 to be adhered to central conductor 1.

Adjustment of oscillation frequency of the second local oscillator circuit is done by pushing up or pulling down Z0 trimmer 5 formed by ETFE coating of ethylene-tetra fluoro ethylen-copolymer as shown in FIG. 4C so as to maintain the state in which it is adhered along first surface 21 of local unit substrate 2.

In a structure as described above, the central conductor and the Z0 trimmer would be in an identical oscillation mode even when the entire tuner is subjected to oscillation. Accordingly, occurrence of howling can be prevented. Also, necessity of applying the adhesive as in the conventional example is eliminated. Therefore, adjustment by estimation, that is, adjustment relying on an estimation of shrinkage due to curing of the adhesive, will be unnecessary, and thus it is possible to prevent deterioration of accuracy in oscillation frequency.

One of the significant reason for influence on the oscillation frequency is moisture. When central conductor 1 is simply formed at a resin substrate or the like, this resin substrate will absorb moisture as it is subjected to aging, causing offset in oscillation frequency. This offset in oscillation frequency is, especially with oscillation at high-frequency (e.g., of 1 GHz), a great problem. Since central conductor 1 is formed on local unit substrate 2 of alumina having superior resistance to moisture, such problem is avoided leading to a high reliability.

Figure 5A:
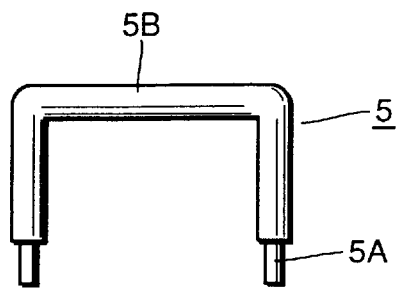
FIG. 5A is a front view of the Z0 trimmer according to the first embodiment of the present invention.
Figure 5B:
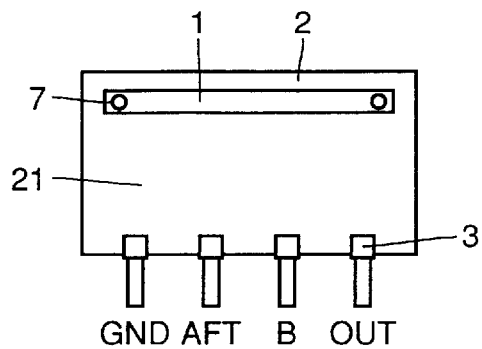
FIG. 5B is a front view of the local unit substrate on which the central conductor according to the first embodiment of the present invention is formed.
Figure 5C:
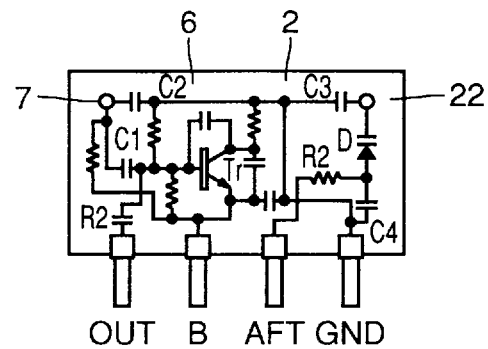
FIG. 5C is a rear view of a local unit substrate on which the central conductor according to the first embodiment of the present invention is formed.

Referring to FIGS. 5A, 5B and 5C, elements identical to those already described with reference to FIGS. 4A to 4C are denoted by identical reference characters. Detailed description thereof will not be repeated here. Central conductor 1 and a component 6 of the second local oscillator circuit are respectively formed at first surface 21 and second surface 22 which are the front and rear surfaces of the local unit substrate. They are in electrical connection via through hole 7.

Thus, according to the first embodiment, the central conductor and the Z0 trimmer will be in an identical oscillation mode even when the entire tuner is subjected to oscillation. Accordingly, occurrence of howling can be prevented. Also, necessity of applying the adhesive for prevention of howling is eliminated. Thus, it is possible to prevent accuracy of oscillation frequency from being degraded due to limitation of adjustment by estimation.

In addition, component 6 of the second local oscillator circuit is formed on surface 22 opposite to first surface 21 of local unit substrate 2 on which central conductor is formed, instead of on tuner main substrate 4. Therefore, there would be some margin on the tuner main substrate 4, enabling a more effective utilization of the space on tuner main substrate, as compared to the conventional example. Also, connection between the central conductor and component 6 of the local oscillator circuit is provided easily by through hole 7.

Second Embodiment

Description will be given in the following for the second embodiment of the present invention. The difference between this embodiment and the above-described first embodiment is that another example of a Z0 trimmer is employed here.

Figure 6:
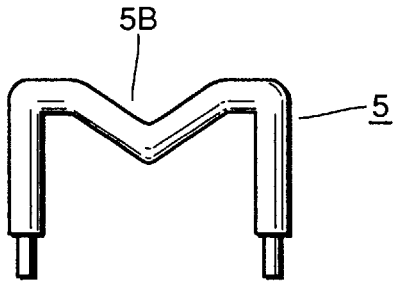
FIG. 6 shows another example of a Z0 trimmer according to a second embodiment of the present invention.

Referring to FIG. 6, another example of the Z0 trimmer according to the present embodiment will be described. In the example already described, the Z0 trimmer had a U-shape. However, with such a Z0 trimmer, somewhat large force is required when it is deformed for adjustment of frequency, especially when it is deformed by pulling it upwards. Thus, an upper portion 5B of the Z0 trimmer in FIG. 5A is provided with a small recess in order to render the U-shape into an M-shape as shown in FIG. 6. In this way, deformation does not require a large force and the operation is made quite easier.

Third Embodiment

The following is a description for the third embodiment of the present invention.

Figure 7:
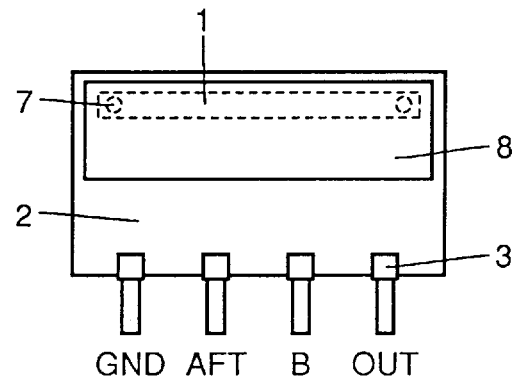
FIG. 7 shows another example of a local unit substrate on which the central conductor is formed according to a third embodiment of the present invention.

Referring to FIG. 7, although the Z0 trimmer employing a coated soft wire has provided insulation from the central conductor, an insulating sheet 8 may be spread over the portion covering at least a central conductor 1 at the side of first surface 21 of local unit substrate 2, instead of the coated soft wire. In such a case, it is not necessary to form the Z0 trimmer by coated wire, and it may be formed by a naked wire.

Fourth Embodiment

The following is a description for the fourth embodiment of the present invention.

The above-described first to third embodiments are effective even when the oscillation frequency is high. It appears that future development in this technical field may tend to require application for still higher frequency (of about 1 GHz), but these first to third embodiments can fully meet this requirement.

However, if it is sufficient to meet the requirement for an oscillation frequency range of only about 500 MHz, it is possible to further simplify the structure as compared to the structure in the description of first to third embodiments. This simplified structure will be described in the following.

When the band for reception is narrow and oscillation frequency of the second local oscillator circuit is not high (to say more particularly, about 500 MHz), influence due to secular change is not so large such that it is possible to form the second local oscillator circuit on tuner main substrate 4. Here, influence due to secular change refers to the fact that the substrate tends to be affected by moisture due to secular change causing change in capacitance and loss of the substrate, resulting in offset of oscillation frequency.

Figure 8A:
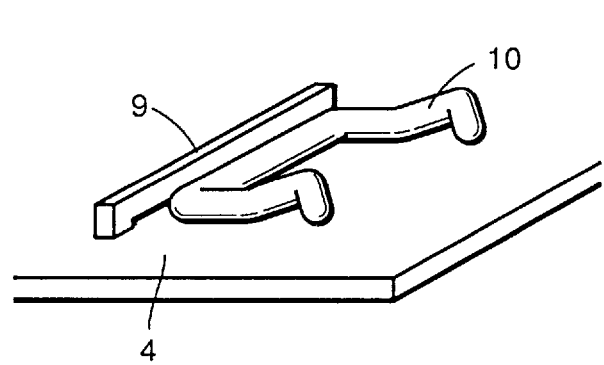
FIG. 8A is a perspective view of a substrate on which a central conductor and a Z0 trimmer are formed according to the fourth embodiment of the present invention.
Figure 8B:
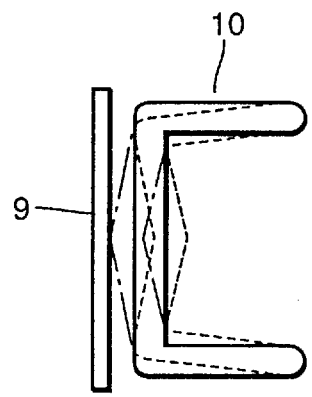
FIG. 8B is a plan view of the substrate on which the central conductor and the Z0 trimmer are formed according to the fourth embodiment of the present invention.
Figure 8C:
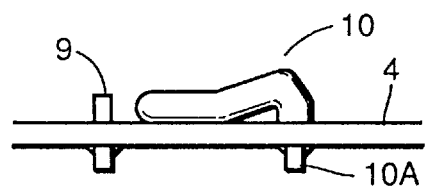
FIG. 8C is a side view of the substrate on which the central conductor and the Z0 trimmer are formed according to the fourth embodiment of the present invention.

Referring to FIGS. 8A, 8B and 8C, a central conductor 9 of low height is inserted to tuner main substrate 4 and is fixed by soldering. Central conductor 9 is formed by a metal plate. Z0 trimmer 10 is formed by an electric wire coated with ethylene-tetra fluoro ethylene-copolymer bent in U-shape, is inserted to tuner main substrate 4 so as to be adjacent to central conductor 9, has its coating removed at a portion 10A where it is inserted to the substrate, and is subjected to soldering.

Adjustment of oscillation frequency is done by deforming the shape of Z0 trimmer 10 formed by an electric wire coated with ethylene-tetra fluoro ethylene-copolymer as shown in FIG. 8B while making the Z0 trimmer 10 to slide such that the state in which it is adjacent to tuner main substrate 4 is maintained.

According to the structure as described above, the central conductor and the Z0 trimmer would be in the same oscillation mode even when the entire tuner is subjected to oscillation, in a similar manner as in the first to third embodiments. Accordingly, occurrence of howling can be avoided. In addition, it is not necessary to apply the adhesive for preventing the occurrence of howling. Thus, it is possible to prevent accuracy of oscillation frequency from being degraded due to limitation of adjustment by estimation.

Figure 9:
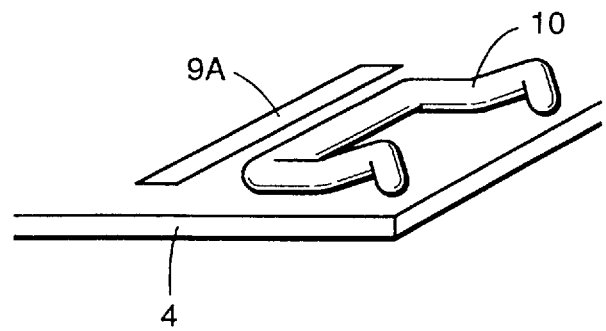
FIG. 9 is a perspective view of another example of a substrate on which a central conductor and a Z0 trimmer are formed according to the fourth embodiment of the present invention.

Referring to FIG. 9, although a metal plate of low height is employed for central conductor 9 in the above-described embodiment shown in FIG. 8, a pattern 9A may be formed directly on tuner main substrate 4. Also, central conductor 9 may be formed of a coated conducting wire.

Fifth Embodiment

Description will now be given in the following for the fifth embodiment of the present invention, with reference to the drawings. The block diagram of a tuner and the schematic diagram of the second local oscillator circuit for the present embodiment have common features with respect to the block diagram of the aforementioned double-conversion tuner and the schematic diagram of the second local oscillator circuit of the double-conversion circuit shown respectively in FIGS. 1 and 2. Thus, description thereof will not be detailed here again.

Figure 10:
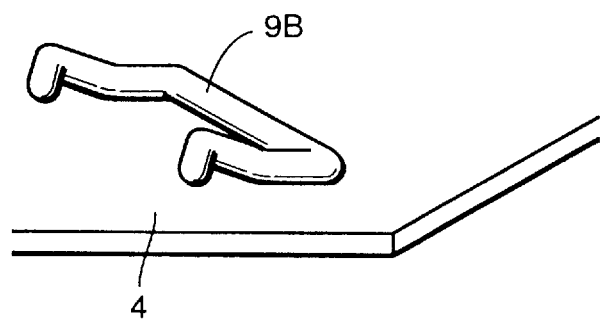
FIG. 10 is a perspective view of a substrate on which a central conductor is formed according to a fifth embodiment of the present invention.

Referring to FIG. 10, an effect similar to the effect obtained in the first embodiment described above with reference to FIGS. 8A, 8B, 8C and 9 can also be obtained even when Z0 trimmer is not employed, central conductor 9B is formed on tuner main substrate 4 from a soft conducting wire such as an electric wire coated with ethylene-tetra fluoro ethylene-copolymer or the like, and adjustment of oscillation frequency is done by changing the shape of central conductor 9B itself.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A tuner circuit, comprising:
   a first IF signal generating circuit for outputting a first IF signal;
   a local oscillator circuit for outputting a local oscillator signal;
   a mixing circuit for mixing said first IF signal and said local oscillator signal to generate a second IF signal; and
   a first substrate on which at least said local oscillator circuit is formed,
   said local oscillator circuit including:
      oscillation means; and
      a coaxial resonator connected to said oscillation means, said coaxial resonator including:
         an impedance variable trimmer for adjusting oscillation frequency including;
            a central conductor provided at a fixed position with respect to said first substrate; and
            an impedance variable trimmer portion with an insulator for providing insulation between said impedance variable trimmer portion and said central conductor,
            said impedance variable trimmer portion and said central conductor being adhered directly to each other by said insulator.

2. The tuner circuit in accordance with claim 1, wherein said local oscillator circuit further includes a second substrate provided to stand up substantially vertically from said first substrate, having a first surface and a second surface,
   said central conductor is formed at said first surface, and
   said impedance variable trimmer portion is arranged at the side of said first surface and is formed from soft conducting wire, said insulator including an insulating coating for covering said soft conducting wire, and said soft conducting wire being provided to stand up from said first substrate along said first surface of said second substrate to be adhered directly to said central conductor by said insulating coating.

3. The tuner circuit in accordance with claim 2, wherein said second substrate is formed of alumina.

4. The tuner circuit in accordance with claim 3, wherein said local oscillator circuit further includes another component in addition to said impedance variable trimmer portion, said central conductor and said insulator, said another component being arranged at said second surface of said second substrate.

5. The tuner circuit in accordance with claim 4, wherein said second substrate has a through hole penetrating said second substrate for electrically connecting said central conductor and said another component.

6. The tuner circuit in accordance with claim 5, wherein said impedance variable trimmer portion is U-shaped.

7. The tuner circuit in accordance to claim 5, wherein said impedance variable trimmer portion is M-shaped.

8. The tuner circuit in accordance with claim 4, wherein said impedance variable trimmer portion is U-shaped.

9. The tuner circuit in accordance to claim 4, wherein said impedance variable trimmer portion is M-shaped.

10. The tuner circuit in accordance with claim 3, wherein said impedance variable trimmer portion is U-shaped.

11. The tuner circuit in accordance to claim 3, wherein said impedance variable trimmer portion is M-shaped.

12. The tuner circuit in accordance with claim 2, wherein said impedance variable trimmer portion is U-shaped.

13. The tuner circuit in accordance to claim 2, wherein said impedance variable trimmer portion is M-shaped.

14. The tuner circuit in accordance with claim 1, wherein said impedance variable trimmer portion is U-shaped.

15. The tuner circuit in accordance with claim 1, wherein said local oscillator circuit further includes a second substrate provided to stand up vertically from said first substrate, having a first surface and a second surface;

said central conductor is formed at said first surface of said second substrate;

said insulator includes an insulating sheet for covering at least a portion of said second substrate where said central conductor is formed;

said impedance variable trimmer portion is arranged at the side of said first surface and is formed from soft conducting wire; and said soft conducting wire is formed to stand up from said first substrate along said first surface of said second substrate and is adhered directly to said central conductor by said insulating sheet.

16. The tuner circuit in accordance with claim 15, wherein said second substrate is formed of alumina.

17. The tuner circuit in accordance with claim 16, wherein said local oscillator circuit further includes another component in addition to said impedance variable trimmer portion, said central conductor and said insulator, said another component being arranged at said second surface of said second substrate.

18. The tuner circuit in accordance with claim 17, wherein said second substrate has a through hole penetrating said second substrate for electrically connecting said central conductor and said other components.

19. The tuner circuit in accordance with claim 18, wherein said impedance variable trimmer portion is U-shaped.

20. The tuner circuit in accordance with claim 17, wherein said impedance variable trimmer portion is U-shaped.

21. The tuner circuit in accordance with claim 16, wherein said impedance variable trimmer portion is U-shaped.

22. The tuner circuit in accordance with claim 15, wherein said impedance variable trimmer portion is U-shaped.

23. The tuner circuit in accordance with claim 1, wherein said central conductor is formed to stand up substantially vertically from said first substrate, including a conductor plate having a shape of which length in one direction along the surface of said first substrate is sufficiently longer than its length in the other direction, said impedance trimmer portion including a soft conducting wire;

said insulator including an insulating coating for covering said soft conducting wire; and said soft conducting wire being adhered directly to said first substrate by said insulating coating.

24. The tuner circuit in accordance with claim 1, wherein said impedance variable trimmer portion is U-shaped.

25. The tuner circuit in accordance with claim 1, wherein said central conductor includes a conductor pattern formed on said first substrate;

said impedance variable trimmer portion includes a soft conducting wire;

said insulator includes an insulating coating for covering said soft conducting wire; and said soft conducting wire is directly adhered to said first substrate by said insulating coating.

26. The tuner circuit in accordance with claim 25, wherein said impedance variable trimmer portion is U-shaped.

27. The tuner circuit, comprising:

a first IF signal generating circuit for outputting a first IF signal;

a local oscillator circuit for generating a local oscillator signal;

a mixing circuit for mixing said first IF signal and said local oscillator signal to generate a second IF signal; and a first substrate on which at least said local oscillator circuit is formed, said local oscillator circuit including:
  oscillation means; and
  a coaxial resonator connected to said oscillating means for correcting influence of the change in oscillation frequency owing to moisture and secular change,
  said coaxial resonator including a central conductor disposed along with first substrate, formed from a soft conducting wire, so that the central conductor can be deformed.

28. The tuner circuit in accordance to claim 1, wherein said impedance variable trimmer portion is M-shaped.

* * * * *